United States Patent
Fujii et al.

(10) Patent No.: US 6,805,808 B2
(45) Date of Patent: Oct. 19, 2004

(54) METHOD FOR SEPARATING CHIPS FROM DIAMOND WAFER

(75) Inventors: Satoshi Fujii, Itami (JP); Noboru Gotou, Itami (JP); Tomoki Uemura, Itami (JP); Toshiaki Saka, Itami (JP); Katsuhiro Itakura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 143 days.

(21) Appl. No.: 10/129,925

(22) PCT Filed: Sep. 10, 2001

(86) PCT No.: PCT/JP01/07854

§ 371 (c)(1),
(2), (4) Date: May 13, 2002

(65) Prior Publication Data

US 2003/0127428 A1 Jul. 10, 2003

(30) Foreign Application Priority Data

Sep. 14, 2000 (JP) ........................................ 2000/279761

(51) Int. Cl.[7] ............................................. H01L 21/301
(52) U.S. Cl. ............................ 216/52; 216/24; 216/67; 216/81; 134/1.1; 134/17; 134/39; 438/33; 438/68; 438/463
(58) Field of Search ................................. 216/2, 24, 52, 216/65, 67, 74, 81; 438/33, 68, 463; 451/57; 134/1.1, 1.2, 17, 20, 21, 39

(56) References Cited

U.S. PATENT DOCUMENTS 5,219,796 A * 6/1993 Quinn et al. .................. 438/68
5,294,381 A * 3/1994 Iguchi et al. ................. 264/400
5,387,776 A * 2/1995 Preiser .................... 219/121.72
6,007,730 A * 12/1999 Shiomi et al. ................. 216/17
6,084,175 A * 7/2000 Perry et al. .................. 136/256

FOREIGN PATENT DOCUMENTS

| JP | 50-28749 | 3/1975 |
| JP | 52-151560 | 12/1977 |
| JP | 56-6451 | 1/1981 |
| JP | 60-167351 | 8/1985 |
| JP | 10-27971 | 1/1998 |
| JP | 10-125958 | 5/1998 |
| JP | 11-162885 | 6/1999 |
| JP | 11-177139 | 7/1999 |
| JP | 2000-21819 | 1/2000 |
| JP | 2001-284293 | 10/2001 |

* cited by examiner

Primary Examiner—Allan Olsen
(74) Attorney, Agent, or Firm—McDermott, Will & Emery (57) ABSTRACT

A method for separating chips from a diamond wafer comprising a substrate, a chemically vapor-deposited diamond layer, and microelectronic elements, with the microelectronic elements protected from thermal damage and degradation caused by the thermally decomposed cuttings produced during the processing steps. (1) Front-side grooves 6 are formed on the chemically vapor-deposited diamond layer 2 by laser processing using a laser such as a YAG, $CO_2$, or excimer laser each having a large output so that the grooves 6 can have a depth 1/100 to 1.5 times the thickness of the diamond layer. (2) The thermally decomposed cuttings produced during the laser processing are removed by using a plasma. (3) Back-side grooves 9 are formed on the substrate 1 by dicing such that the back-side grooves 9 are in alignment with the front-side grooves 6. (4) The diamond wafer 4 is divided into individual chips 10 by applying mechanical stresses.

6 Claims, 8 Drawing Sheets

2 Chemically vapor-deposited diamond layer
5 Resist layer
3 SAW filter element
7 Cuttings
4 Diamond wafer
6 Front-side groove
1 Substrate

FIG. 2(d)

2 Chemically vapor-deposited diamond layer
1 Substrate

Prior Art

FIG. 3(b)

Prior Art

Prior Art

FIG. 4(b)

Prior Art

FIG. 5(a)

Prior Art

FIG. 5(b)

Prior Art

METHOD FOR SEPARATING CHIPS FROM DIAMOND WAFER

TECHNICAL FIELD

The present invention relates to a method for separating chips from a diamond wafer that comprises a substrate, a polycrystalline or single-crystalline diamond layer formed on the substrate by chemical vapor deposition, and a plurality of microelectronic elements formed on the diamond layer.

BACKGROUND ART

There is a method in which chips are separated by cutting a diamond wafer comprising a substrate, a chemically vapor-deposited diamond, and a plurality of microelectronic elements. However, the cutting (hereinafter referred to as "dicing") of the chemically vapor-deposited diamond with a diamond saw blade cannot be performed stably because the dicing is conducted by the same substance.

Figure 3A:
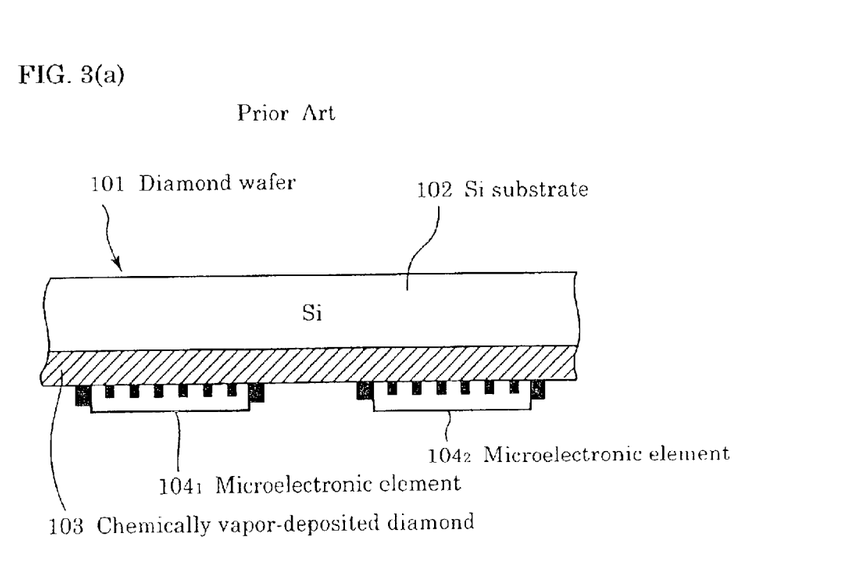
FIGS. 3(a) to 3(c) are schematic cross-sectional views illustrating a method for separating chips by a prior art.
Figure 3B:
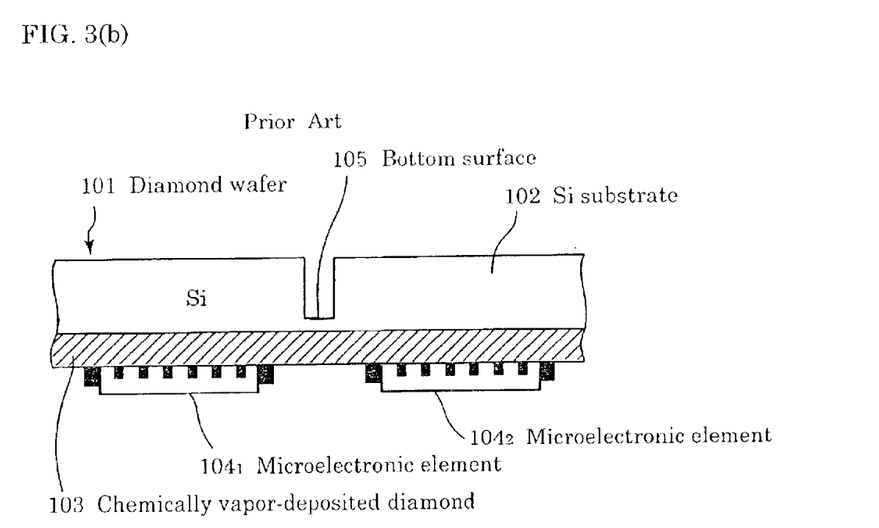
Figure 3C:
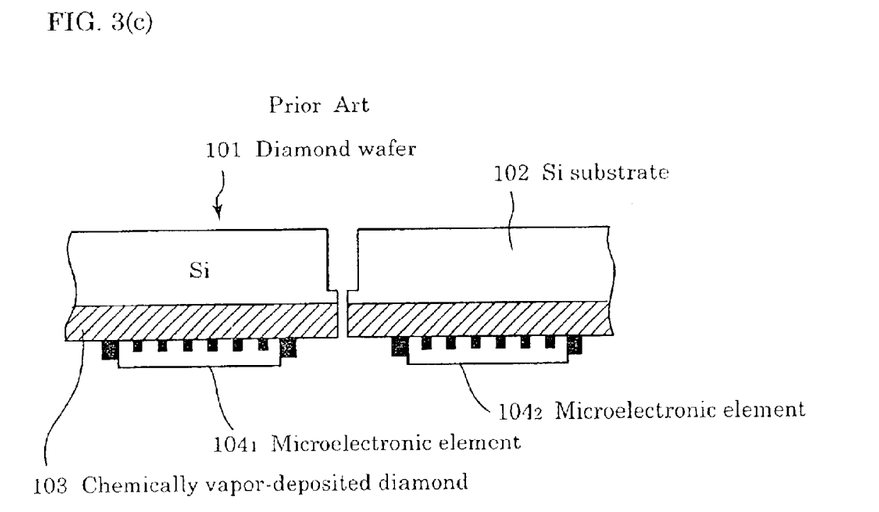

To solve this problem, engineers have devised various methods in which chips are separated from a diamond wafer by using a laser together with another method such as dicing. One of the methods has been disclosed by the published Japanese patent application Tokukai 2000-21819. FIGS. 3(a) to 3(c) illustrate this method. In FIG. 3(a), a diamond wafer 101 comprises an Si substrate 102, a chemically vapor-deposited diamond layer 103 formed on the substrate 102, and a plurality of microelectronic elements $104_1$ and $104_2$ formed on the diamond layer 103. The method for separating chips is illustrated in FIGS. 3(b) and 3(c). First, as shown in FIG. 3(b), the Si substrate 102 is half-cut by a method such as dicing to form a groove. The groove has a depth less than the thickness of the substrate 102 and more than half the thickness of the substrate 102. Next, the bottom surface 105 of the half-cut groove is irradiated with a laser beam to cut the remaining part of the substrate 102 and the diamond layer 103 with a width narrower than that of the foregoing groove. FIG. 3(c) shows separated chips each having a single microelectronic element.

Figure 4A:
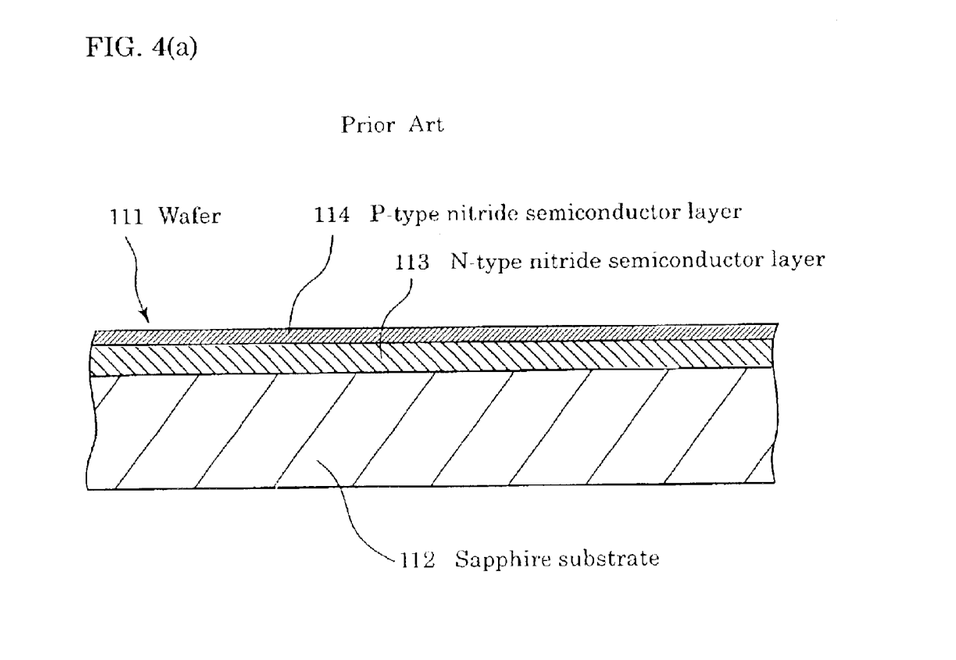
FIGS. 4(a) and 4(b) are schematic cross-sectional views illustrating another method for separating chips by another prior art.
Figure 4B:
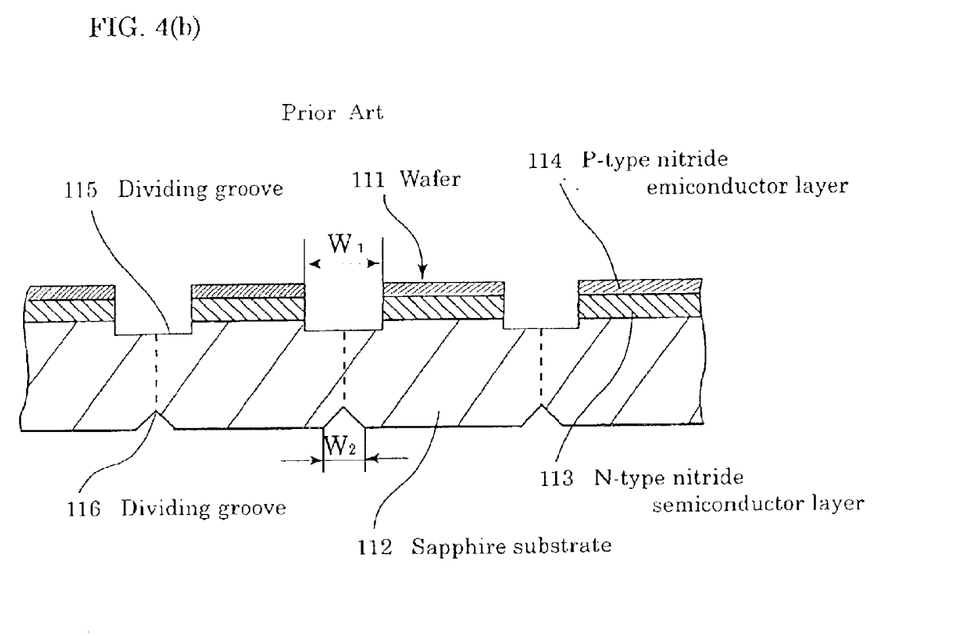

Another published Japanese patent application, Tokukaihei 10-125958, has disclosed another method as shown in FIGS. 4(a) and 4(b). FIG. 4(a) illustrates a wafer 111 comprising a sapphire substrate 112, an n-type nitride semiconductor layer 113 laminated on the substrate 112, and a p-type nitride semiconductor layer 114 laminated on the n-type layer 113. Chips are separated by the method shown in FIG. 4(b). First, front-side dividing grooves 115 are formed such that they penetrate through the semiconductor layers and into a part of the sapphire substrate 112. Next, back-side dividing grooves 116 having the width $W_2$ narrower than the width $W_1$ of the front-side dividing grooves 115 are formed on the sapphire substrate 112 at the positions aligned with the centers of the front-side dividing grooves 115. Finally, the wafer 111 is divided into individual chips having a single microelectronic element by the application of mechanical stresses.

Figure 5A:
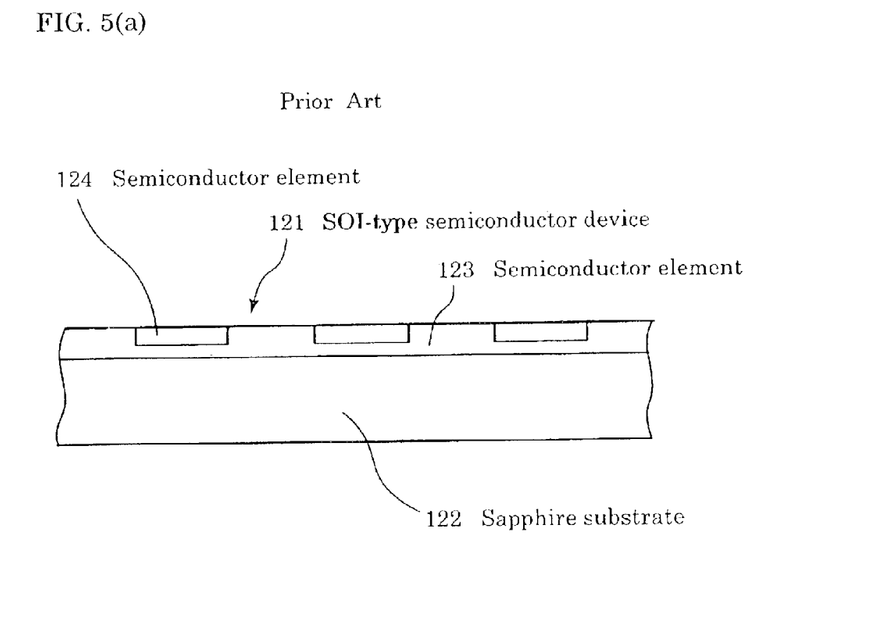
FIGS. 5(a) and 5(b) are schematic cross-sectional views illustrating yet another method for separating chips by yet another prior art.
Figure 5B:
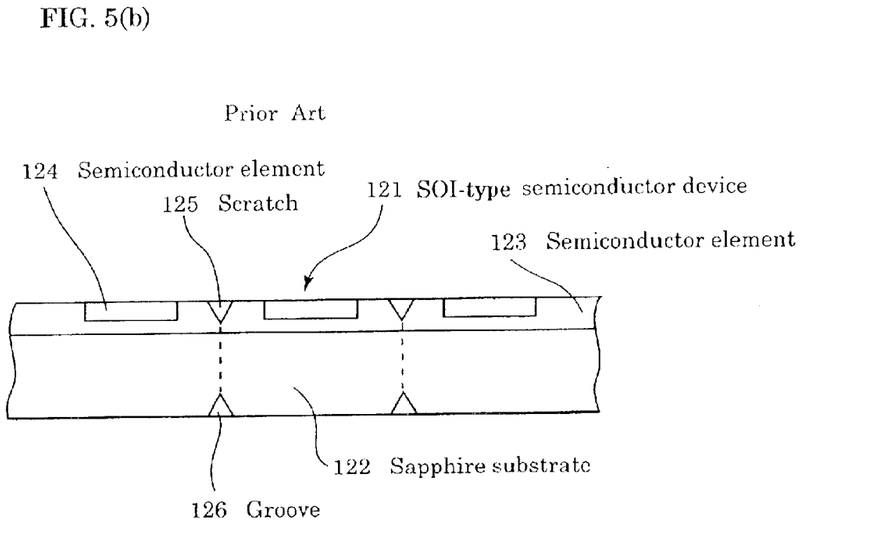

Yet another published Japanese patent application, Tokukaishou 56-6451, has disclosed another method as shown in FIGS. 5(a) and 5(b). FIG. 5(a) illustrates a silicon-on-Insulator (SOI)-type semiconductor device 121 comprising a sapphire substrate 122, a single-crystalline silicon layer 123 formed on the substrate 122 by the vapor phase growth method, and semiconductor elements 124 formed in the silicon layer 123. As shown in FIG. 5(b), scratches 125 are formed on the surface of the silicon layer 123 with a diamond cutter. Next, grooves 126 are formed on the sapphire substrate 122 with a laser beam at the positions corresponding to the foregoing scratches 125. Finally, the SOI-type semiconductor device 121 is divided into individual chips by the application of mechanical stresses.

The method disclosed by Tokukai 2000-21819 has a processing step in which the total thickness of the chemically vapor-deposited diamond layer is cut by the irradiation of a laser beam. Consequently, a prolonged processing time is required in order to protect the microelectronic elements from thermal damage. The method disclosed by Tokukaihei 10-125958 has a processing step in which the total thickness of the semiconductor layers and a part of the thickness of the substrate are processed. The cuttings produced by the step may cause problems by adhering to the surface of the microelectronic elements. Similarly, the method disclosed by Tokukaishou 56-6451 produces cuttings during the laser processing. The cuttings may contaminate chips by adhering to them.

DISCLOSURE OF THE INVENTION

In order to solve the above-described problems, the present invention offers a method for separating chips from a diamond wafer having a chemically vapor-deposited diamond layer and microelectronic elements, with the microelectronic elements protected from thermal damage and degradation caused by the thermally decomposed cuttings produced during the processing steps.

In the present invention, chips are separated from a diamond wafer comprising a substrate, a polycrystalline or single-crystalline chemically vapor-deposited diamond layer formed on the substrate, and a plurality of microelectronic elements formed on the diamond layer. The chip separation is performed by the following steps: (1) Front-side grooves are formed on the chemically vapor-deposited diamond layer by laser processing using a laser such as a yttrium-aluminum-garnet (YAG), $CO_2$, or excimer laser each having a large output so that the grooves can have a depth 1/100 to 1.5 times the thickness of the diamond layer. (2) The thermally decomposed cuttings produced during the laser processing are removed by using a plasma. (3) Backside grooves are formed on the substrate by dicing such that the back-side grooves are in alignment with the front-side grooves. (4) The diamond wafer is divided into individual chips by applying mechanical stresses.

It is desirable that the depth of the back-side grooves formed on the substrate by the foregoing dicing be such that the remaining thickness of the substrate is at most 100 μm.

When the depth of the laser processing of the chemically vapor-deposited diamond layer is less than the thickness of the diamond layer (i.e., when the laser processing remains within the thickness of the diamond layer), an oxygen gas is used for producing the plasma for removing the thermally decomposed cuttings.

When the depth of the laser processing of the chemically vapor-deposited diamond layer is at least the thickness of the diamond layer (i.e., when the laser processing is extended into the substrate) and when the substrate is made of Si or SiC, the plasma for removing the thermally decomposed cuttings is produced by using an oxygen gas, one of the CF-family gases that are $CF_4$, $C_2F_6$, $CHF_3$, and $C_4F_8$, and a mixed gas of oxygen and one of the CF-family gases.

When the depth of the laser processing of the chemically vapor-deposited diamond layer is at least the thickness of the diamond layer and when the substrate is made of sapphire, AlN, or GaAs, the plasma for removing the thermally decomposed cuttings is produced by using one of the CH-family gases that is, $CH_4$ or $C_2H_6$ or one of the Cl-containing gases, that is, $BCl_3$ or $CCl_4$.

BEST MODE FOR CARRYING OUT THE INVENTION

EXAMPLE 1

It is desirable that the substrate to be used in the present invention be either a single material made of Si, SiC, sapphire, AlN, or GaAs or a combination of one of the foregoing materials and Si coexisting with a metal such as Pt. In this example, an Si substrate having a thickness of 1 mm was prepared. This example is explained below by referring to FIGS. 1 and 2(a) to 2(f).

Figure 2A:
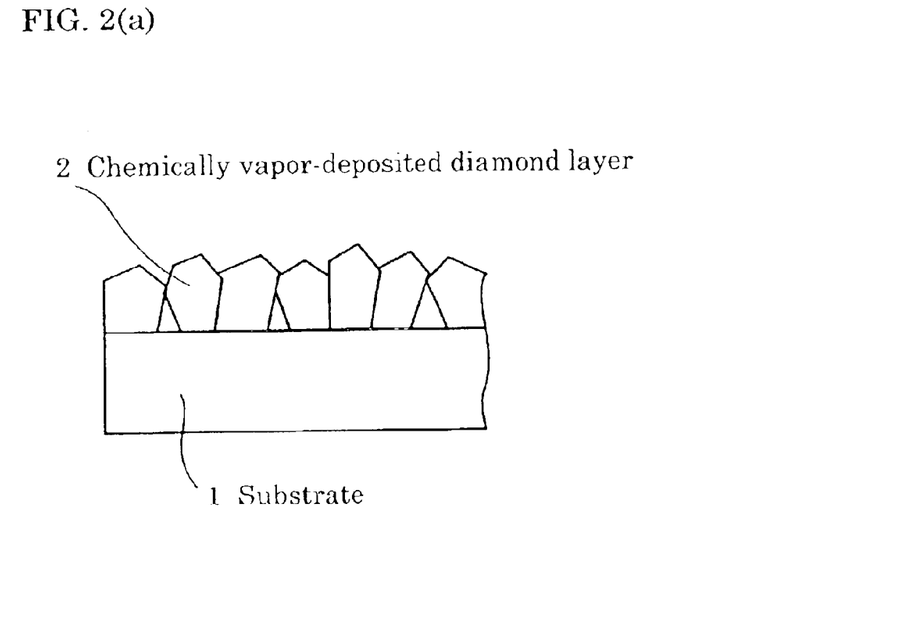
FIGS. 2(a) to 2(f) are schematic cross-sectional views illustrating the steps for separating chips by the method of the present invention.

As shown in FIG. 2(a), a chemically vapor-deposited diamond layer 2 having a thickness of 35 $\mu$m was grown on an Si substrate 1. For this process, the microwave plasma chemical-vapor-deposition (CVD) method was used with a reaction gas composed of an $H_2$ gas and a 2-vol. % $CH_4$ gas. It is desirable that the diamond layer 2 to be used in the present invention have a thickness of 0.1 to 1,000 $\mu$m. If less than 0.1 $\mu$m, it is unnecessary to rely on the present invention for separating chips. It is impractical to produce a diamond layer having a thickness exceeding 1,000 $\mu$m. The conditions of the microwave plasma CVD method were as follows:

Power of the microwave: 150 W
Reaction gas: $CH_4$: $H_2$=2:100 in volume
Total flow rate of the reaction gas: 50 sccm
Gas pressure: 5.33 Pa
Temperature during the layer formation: 800° C.

Figure 2B:
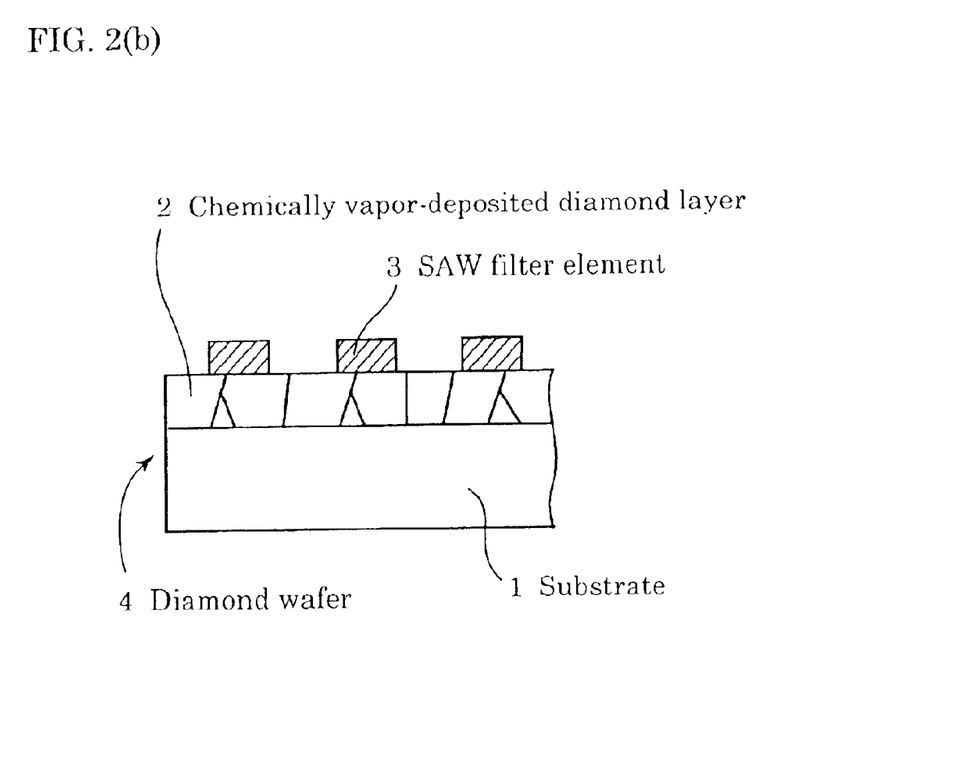

As shown in FIG. 2(b), the diamond layer 2 was mechanically polished to a thickness of 20 $\mu$m by using a diamond-electroplated wheel. The diamond layer had an average surface unevenness of at most 2 nm. The number of surface defects on the diamond layer that were 0.5 $\mu$m or larger was at most 50/cm$^2$.

Figure 2C:
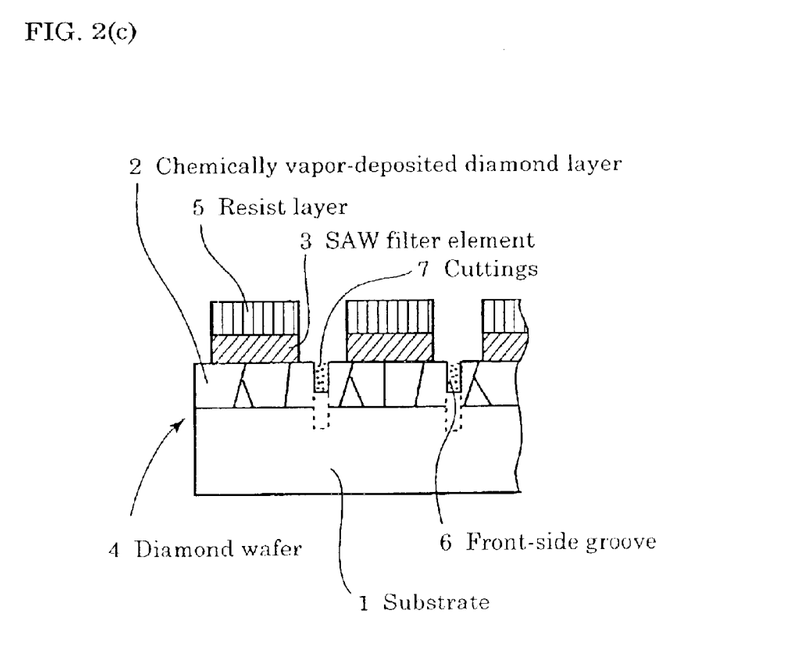
Figure 2D:
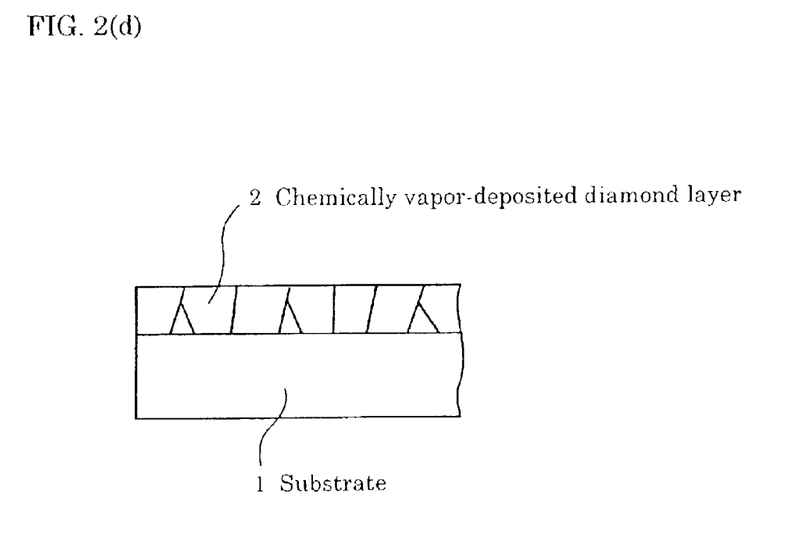

As shown in FIG. 2(c), specified surface-acoustic-wave (SAW) filter elements 3 were formed on the diamond layer 2 to complete a diamond wafer 4. Patterning was conducted by a photolithographic technique in accordance with the size of the SAW filter elements 3. Thus, the SAW filter elements 3 were covered with resist layers 5. Subsequently, as shown in FIG. 2(d), front-side grooves 6 were provided as shown by the solid lines. The front-side grooves 6 were formed by sweeping a laser beam at the places where no resist layers 5 were provided on the diamond layer 2. The laser processing was carried out under the following conditions using a YAG laser:

Power at the laser-processing surface: 0.38 W
Processing speed: 2 mm/sec.
Depth of the groove: 5 $\mu$m The groove depth of 5 $\mu$m is a quarter of the thickness of the diamond layer, which is 20 $\mu$m.

It is desirable that the depth of the groove be 1/100 to 1.5 times the thickness of the diamond layer 2. If the mechanical breaking of the diamond wafer 4 is possible, it is desirable that the groove have the smallest possible depth in terms of the processing time and the thermal effects on the microelectronic elements. Therefore, the depth 1/100 the thickness of the diamond layer is sufficient. In the majority of cases, the laser processing remains within the thickness of the diamond layer. If the laser processing is extended into the substrate 1, the depth of the groove should be at most 1.5 times the thickness of the diamond layer 2, and the laser processing should be performed slowly with sufficient time to avoid adverse thermal effects on the microelectronic elements.

Although a YAG laser was used in this example, another laser such as a $CO_2$ laser or an excimer laser may be used provided that they have a large output. The laser light must have a wavelength longer than the wavelength corresponding to the band-gap energy of the diamond layer (5.5 eV) and shorter than the wavelength corresponding to the band-gap energy of the Si substrate (1.1 eV). Specifically, it is desirable that the wavelength be 250 to 1,120 nm. When the laser light has a wavelength in the above-mentioned range, its energy is absorbed by the Si substrate, but it is relatively allowed to pass through the diamond layer. More specifically, when the laser light having a wavelength in the above-mentioned range is used to inject a required amount of thermal energy into the diamond wafer so that a shallow groove can be formed in the diamond layer, the laser light having passed through the diamond layer forms a degraded layer in the Si substrate. The degraded layer is mechanically brittle and facilitates the breaking operation of the diamond wafer to be performed in the latter part of the process.

Subsequently, the thermally decomposed cuttings 7 produced during the groove formation were removed to clean thee diamond wafer by using a plasma-generating apparatus equipped with a barrel-type chamber. The plasma treatment was carried out under the following conditions:

Pressure: 6.67 Pa
Gas: oxygen
Total gas flow rate: 50 sccm
Radio frequency (RF) power source: power: 300 W; frequency: 13.56 MHz
Time: 5 minutes The gas for the plasma treatment must be selected on the following basis. When the laser processing remains within the thickness of the diamond layer 2, oxygen is to be used. When the laser processing is extended into the substrate 1, the gas must be changed according to the material of the substrate. When the substrate is made of Si, which was used in this example, or SiC, the desirable basic reaction is $Si+4F=SiF_4$. Therefore, it is preferable to use an oxygen gas, a CF-family gas such as $CF_4$, $C_2F_6$, $CHF_3$, or $C_4F_8$, or a mixed gas of oxygen and the CF-family gas. When the substrate is made of sapphire, AlN, or GaAs, it is preferable to use a CH-family gas such as $CH_4$ or $C_2H_6$ or a Cl-containing gas such as $BCl_3$ or $CCl_4$.

Figure 2E:
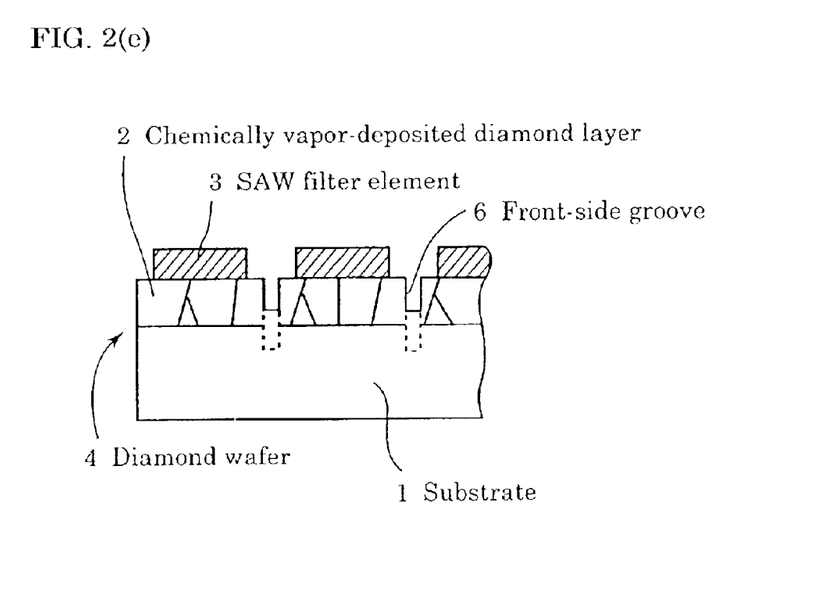

When the diamond layer 2 is thermally decomposed by the laser light, the decomposed products are graphite and carbon. If they remain in the groove, the good insulating property cannot be maintained. Therefore, the process for removing the thermally decomposed cuttings 7 is an important process. This cleaning process is essential especially for the production of the microelectronic elements that require an excellent insulating property, such as the SAW filter elements 3 in this example or laser diodes. As shown in FIG. 2(e), the resist layers 5 were removed by cleaning the wafer using an organic solvent such as acetone or isopropyl alcohol.

Figure 1:
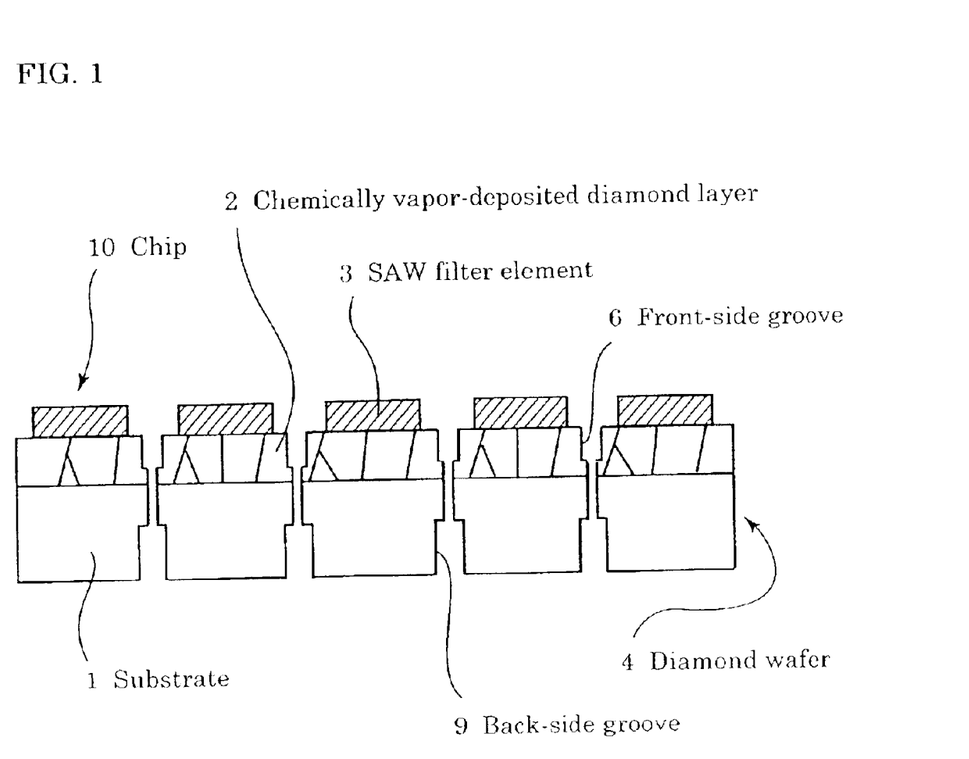
FIG. 1 is a schematic cross-sectional view showing a diamond wafer divided into individual chips by the method of the present invention.
Figure 2F:
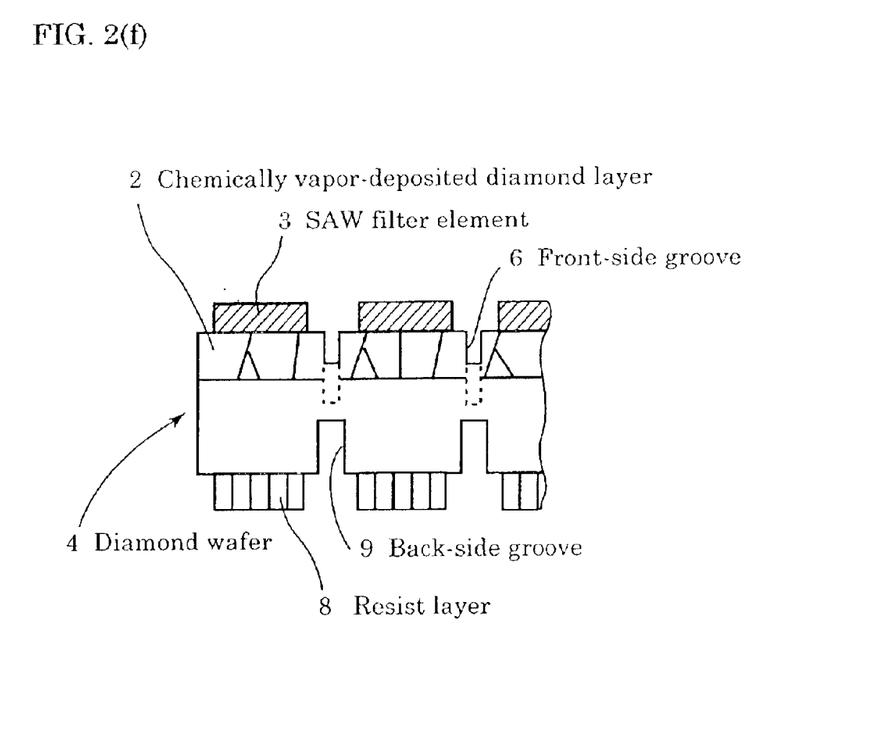

Then, a double-side mask aligner and a photolithographic technique provided the patterning on the back side in alignment with the front-side grooves formed by the YAG laser. Thus, the Si substrate 1 was covered with resist layers 8. Subsequently, as shown in FIG. 2(f), back-side grooves 9 were formed by dicing the Si substrate 1 with a dicing apparatus under the following conditions:

Machining speed: 5 mm/sec.
Rotational speed of the saw blade: 30,000 rpm
Dicing depth: remaining thickness of the Si substrate: 10 $\mu$m It is desirable that the dicing depth into the substrate 1 be such that the remaining thickness of the substrate is at most 100 $\mu$m. During the dicing operation, the saw blade must be apart from the diamond layer. If, however, the remaining thickness of the substrate is more than 100 $\mu$m, the breaking operation of the wafer becomes difficult. After the dicing operation, the resist layers 8 were removed by the above-mentioned organic solvent. An adhesive tape was attached to the Si substrate 1. The breaking operation was performed by applying roller pressures to the side where the SAW filter elements 3 were provided. Thus, individual chips 10 were separated as shown in FIG. 1.

EXAMPLE 2

As with Example 1, Example 2 is explained by referring to FIGS. 1 and 2(a) to 2(f).

As shown in FIG. 2(a), an AlN substrate 1 having a thickness of 0.5 mm was prepared, and a chemically vapor-deposited diamond layer 2 having a thickness of 15 $\mu$m was grown on the substrate 1 by the microwave plasma CVD method under the same conditions as in Example 1. As shown in FIG. 2(b), the diamond layer 2 was mechanically polished to a thickness of 10 $\mu$m by using a diamond-electroplated wheel. The diamond layer had an average surface unevenness of at most 2 nm. The number of surface defects 0.5 $\mu$m or more in size on the diamond layer was at most 50/cm².

As shown in FIG. 2(c), as with Example 1, specified SAW filter elements 3 were formed on the diamond layer 2 to complete a diamond wafer 4. Patterning was conducted by a photolithographic technique in accordance with the size of the SAW filter elements 3. Thus, the SAW filter elements 3 were covered with resist layers 5. Subsequently, as shown in FIG. 2(d), front-side grooves 6 were provided as shown by the dotted lines. The front-side grooves 6 were formed by sweeping a laser beam at the places where no resist layers 5 were provided on the diamond layer 2. The laser processing was carried out under the following conditions using a YAG laser:

Power at the laser-processing surface: 0.3 W
Processing speed: 2 mm/sec.
Depth of the groove: 12 $\mu$m As shown by the dotted lines, the front-side grooves 6 were formed such that they penetrated into the AlN substrate 1.

Subsequently, the thermally decomposed cuttings 7 of the diamond layer 2 and the AlN substrate 1 were removed to clean the wafer by using a plasma-generating apparatus equipped with a barrel-type chamber. The plasma treatment was carried out under the following two conditions:

Condition 1
  Pressure: 6.6 Pa
  Gas: oxygen
  Total gas flow rate: 50 sccm
  RF power source: power: 300 W; frequency: 13.56 MHz
  Time: 5 minutes Condition 2
  Pressure: 6.6 Pa
  Gas: $BCl_3$
  Total gas flow rate: 50 sccm
  RF power source: power: 300 W; frequency: 13.56 MHz
  Time: 15 minutes Then, a double-side mask aligner and a photolithographic technique provided the patterning on the back side in alignment with the front-side grooves formed by the YAG laser. Thus, the AlN substrate 1 was covered with resist layers 8. Subsequently, as shown in FIG. 2(f), back-side grooves 9 were formed by dicing the AlN substrate 1 with a dicing apparatus under the following conditions:

Machining speed: 10 mm/sec.
Rotational speed of the saw blade: 30,000 rpm
Dicing depth: remaining thickness of the AlN substrate: 10 $\mu$m After the dicing operation, the resist layers 8 were removed by the above-mentioned organic solvent. An adhesive tape was attached to the AlN substrate 1. The breaking operation was performed by applying roller pressures to the side where the SAW filter elements 3 were provided. Thus, individual chips 10 were separated as shown in FIG. 1.

The chips 10 were produced by using an Si substrate in Example 1 and by using an AlN substrate in Example 2. In both cases, the process cuttings of the chemically vapor-deposited diamond layer 2 produced during the laser processing were removed by the plasma treatment. The chips 10 produced in Examples 1 and 2 showed excellent qualities such as an insulating resistance as high as 10 M$\Omega$ or more.

Industrial Applicability

The present invention improves the method for separating chips from a diamond wafer comprising a substrate, a chemically vapor-deposited diamond layer, and microelectronic elements. In the present invention, the chips are separated from the diamond wafer by the following process: (1) the laser processing of the diamond layer for forming grooves, (2) the removal of the process cuttings by plasma treatment, (3) the dicing of the substrate, and (4) the breaking of the wafer. This process enables the production of the chips having excellent qualities without impairing the performance of the microelectronic elements.

What is claimed is:

1. A method for separating chips from a diamond wafer, the diamond wafer comprising:
    (a) a substrate;
    (b) one of a polycrystalline chemically vapor-deposited diamond layer and a single-crystalline chemically vapor-deposited diamond layer each formed on the substrate; and
    (c) a plurality of microelectronic elements formed on the chemically vapor-deposited diamond layer;

the method comprising the steps of:

(1) forming front-side grooves on the chemically vapor-deposited diamond layer by laser processing, the front-side grooves having a depth $\frac{1}{100}$ to 1.5 times the thickness of the chemically vapor-deposited diamond layer;

(2) removing by a plasma the thermally decomposed cuttings produced during the laser processing;

(3) forming back-side grooves on the substrate by dicing the substrate with a diamond saw blade such that the back-side grooves are in alignment with the front-side grooves; and (4) breaking the diamond wafer by applying mechanical stresses to separate chips each having a single microelectronic element.

2. A method as defined in claim 1, wherein when the depth of the laser processing of the chemically vapor-deposited diamond layer is less than the thickness of the chemically vapor-deposited diamond layer, the gas for producing the plasma for removing the thermally decomposed cuttings is oxygen.

3. A method as defined in claim 1, wherein when the depth of the laser processing of the chemically vapor-deposited diamond layer is at least the thickness of the chemically vapor-deposited diamond layer and when the substrate is made of one of Si or SiC, the gas for producing the plasma for removing the thermally decomposed cuttings is a gas selected from the group consisting of:

(a) oxygen;

(b) one of the CF-family gases that are $CF_4$, $C_2F_6$, $CHF_3$, and $C_4F_8$; and (c) a mixed gas of oxygen and one of the CF-family gases.

4. A method as defined in claim 1, wherein when the depth of the laser processing of the chemically vapor-deposited diamond layer is at least the thickness of the chemically vapor-deposited diamond layer and when the substrate is made of one of sapphire, AlN, or GaAs, the gas for producing the plasma for removing the thermally decomposed cuttings is a gas selected from the group consisting of:

(a) one of the CH-family gases that are $CH_4$ and $C_2H_6$; and (b) one of the Cl-containing gases that are $BCl_3$ and $CCl_4$.

5. A method as defined in claim 1, wherein the laser for the laser processing is one of a YAG laser, a $CO_2$ laser, or an excimer laser each producing a laser lightwave having a wavelength of 250 to 1,120 nm.

6. A method as defined in claim 1, wherein the depth of the back-side grooves formed on the substrate by dicing the substrate with a diamond saw blade is such that the remaining thickness of the substrate is at most 100 $\mu$m.

* * * * *